United States Patent [19]

Cain

[11] Patent Number: 5,242,532
[45] Date of Patent: Sep. 7, 1993

[54] DUAL MODE PLASMA ETCHING SYSTEM AND METHOD OF PLASMA ENDPOINT DETECTION

[75] Inventor: John L. Cain, Schertz, Tex.

[73] Assignee: VLSI Technology, Inc., San Jose, Calif.

[21] Appl. No.: 854,527

[22] Filed: Mar. 20, 1992

[51] Int. Cl.$^5$ .......................................... H01L 21/00
[52] U.S. Cl. .................................... 156/626; 156/653; 156/627; 156/643; 156/345; 437/7; 204/192.33
[58] Field of Search ............... 156/345, 643, 626, 627, 156/653; 204/192.33, 298.32, 298.03, 298.33; 437/7, 8

[56] References Cited

U.S. PATENT DOCUMENTS

| | | | |
|---|---|---|---|
| 4,207,137 | 6/1986 | Tretola | 156/627 |
| 4,357,195 | 11/1982 | Gorin | 156/626 |
| 4,496,425 | 1/1985 | Kuyel | 156/643 |
| 4,839,311 | 6/1989 | Riley et al. | 437/7 |
| 4,936,967 | 6/1990 | Ikuhara et al. | 204/192.33 |
| 4,954,212 | 9/1990 | Gabriel et al. | 156/627 |
| 5,014,217 | 5/1991 | Savage et al. | 204/298.32 |
| 5,094,712 | 3/1992 | Becker et al. | 156/643 |

FOREIGN PATENT DOCUMENTS

| | | |
|---|---|---|
| 59-061036 | 4/1984 | Japan. |
| 61-174631 | 8/1986 | Japan. |
| 63-288024 | 11/1988 | Japan. |

*Primary Examiner*—Brian E. Hearn
*Assistant Examiner*—George Goudreau
*Attorney, Agent, or Firm*—Flehr Hohbach Test Albritton & Herbert

[57] ABSTRACT

A dual mode plasma etching system and method for plasma etching endpoint detection etches a designated layer of a specified material on a substrate without exposing the substrate surface to a high-energy etching plasma. The substrate is prepared for etching by depositing a thin film of a second material distinct from the specified material on the substrate surface. The designated layer of specified material is formed on top of the thin film. Etching of the designated layer in a plasma etching chamber then proceeds while a preferably high level of power is applied to the plasma etching chamber. The dual mode etching system generates an endpoint signal resulting in termination of the high-power etch when the plasma etching chamber begins etching the thin film of second material. Portions of the thin film remaining on the substrate are then removed using a process less damaging to the substrate than etching at high power.

7 Claims, 9 Drawing Sheets

PRIOR ART

DUAL MODE PLASMA ETCHING SYSTEM AND METHOD OF PLASMA ENDPOINT DETECTION

The present invention relates generally to plasma etching processes used in semiconductor circuit manufacturing and particularly to methods and systems for detecting when a plasma etch process has completed the etching of a particular layer on a semiconductor wafer.

BACKGROUND OF THE INVENTION

Plasma etchers are frequently used in semiconductor processing when a relatively straight vertical edge is needed. For instance, when etching the polysilicon gate of a MOS transistor, undercutting the polysilicon can adversely affect the operation of the transistor. Undercutting is frequently encountered when etching is performed using a liquid etching method. Plasma etching, which uses ions accelerated by an electric field, tends to etch only horizontal exposed surfaces and therefore avoids undercutting.

An important aspect of all etching processes is stopping the etching process after the layer being etched has been removed but before the next layer down is destroyed. This is often called "endpoint" detection—for detecting the completion of etching of a particular layer. For example, in fabricating MOS transistors it is necessary to etch away portions of a dielectric material covering a silicon substrate so as to expose contact regions on the surface of the substrate. A metal layer is then deposited on the exposed substrate regions in order to establish electrical contact with the underlying substrate. Unfortunately, damage may accrue to the contact areas of the substrate if the etching process is allowed to continue for a sufficient period after the dielectric material overlaying the contact areas has been removed. Such damage is known to have occurred despite employment of etching systems (such as the GCA Waferetch 616 triode etcher) having state of the art "endpoint" detection equipment.

Referring to FIG. 1, there is shown a triode etcher system 100. The system 100 has an etching chamber 102 with upper and lower cathodes 104 and 106, respectively, and a screen anode 108. The screen anode 108 is located between the two cathodes and is grounded. A semiconductor wafer 110 is placed in the chamber on the lower cathode 106. In this example the wafer 110 has a silicon substrate 112 which supports a dielectric layer 114. The dielectric layer 114 has been masked with resist 118 in order to define regions of dielectric layer 114 to be etched. Etching of the defined regions of the dielectric results in the exposure of contact regions on the surface of the substrate 112 over which metal contacts will be deposited. The interior of the etching chamber is filled with a gaseous etching plasma 120.

The system has a 13.56 megahertz RF power supply 130 which has a characteristic impedance of 50 ohms. The chamber 102, however, has a characteristic impedance of around 1000 ohms at this frequency. Without the use of a compensating circuit, this impedance mismatch would cause most of the power output by the power supply to be reflected off the load (i.e., the chamber) and back to the source, which could damage the power supply 130. To overcome this problem, most or all etching systems use a compensating circuit 132, sometimes called an impedance transformation circuit, which matches the amplifier to the plasma. In a triode etcher such as the one shown in FIG. 1, this circuit includes an inductor coil L1 and three tunable capacitors C1, C2 and C3. A controller 134 automatically monitors the reflected power and adjusts the three capacitors until the reflected power is less than a specified threshold value, and also splits the power between the upper and lower electrodes.

In general, the plasma 120 etches the top layer of the wafer 110 only when the power supply 130 is activated and when the power reflected by the plasma chamber is relatively low. Activating the power supply 130 "strikes" the plasma, and activates the etching process. While etching any particular layer, light is generated at frequencies corresponding to the chemical makeup of the layer being etched. That is, the layer being etched chemically combines with the plasma, creating predictable chemical compounds, and the light frequencies present in the plasma correspond to these chemical compounds.

In many plasma etching systems the endpoint of the etching process is detected using a light or optical sensor 140. Typically, the optical sensor 140 is set up, using narrow bandpass filters, to monitor the intensity of light at a frequency associated with the layer being etched. When the measured intensity falls below a specified threshold, indicating that etching is complete, the sensor 140 generates an endpoint signal that is transmitted over line 142 to the controller 134, which turns off the power supply 130 and thereby stops the etching process.

Nonetheless, in conventional etching systems such as that depicted in FIG. 1 the endpoint signal may not be generated until the confined plasma has etched away substantially all of the dielectric material 114 over the contact areas on the surface of the substrate 112. In some instances the delay between completion of the dielectric etch and the subsequent disengagement of the power supply 130 has allowed the plasma to significantly damage the exposed contact surfaces of the substrate 112. Plasma etch damage is known to have a particularly deleterious effect upon the reliability of, for example, dynamic random access memory (DRAM) semiconductor memory devices. It is therefore an object of the present invention to provide an etching process capable of removing a defined region of a specified layer of a semiconductor structure while inflicting minimal damage upon the underlying surface.

SUMMARY OF THE INVENTION

In summary, the present invention is a plasma etching endpoint detection system and dual-mode plasma etching technique. The dual mode etching technique contemplates etching a designated layer of a specified material on a substrate without exposing the substrate surface to a high-energy etching plasma. The substrate is prepared for etching by depositing a thin film of a second material distinct from the specified material on the substrate surface. The designated layer of specified material is then formed on top of the thin film. Etching of the designated layer in a plasma etching chamber then proceeds while a preferably high level of power is applied to the plasma etching chamber. The inventive etching system generates an endpoint signal resulting in termination of the high-power etch when the plasma etching chamber begins etching the thin film of second material. Portions of the thin film remaining on the substrate are then removed using a process less damaging to the substrate than etching at high power.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1:
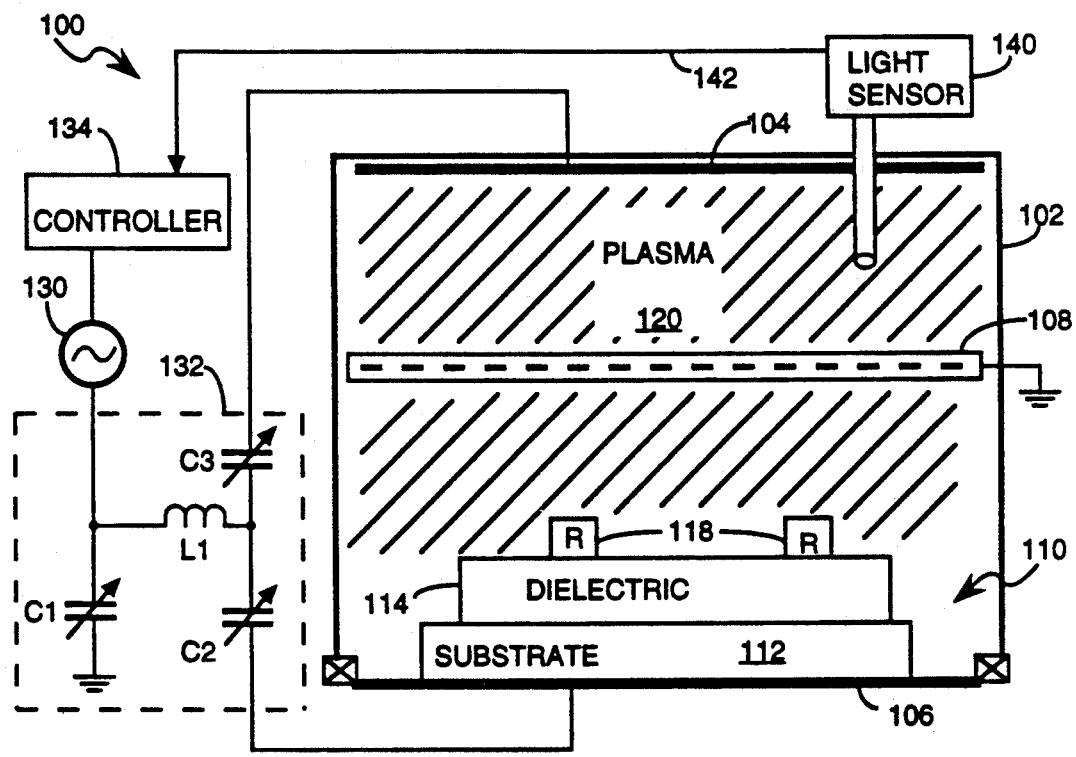
FIG. 1 is a block diagram of a prior art triode plasma etcher system.

Referring to FIG. 1, the controller 134 used in a typical plasma etcher comprises a microprocessor or microcontroller operative to control the etching process by monitoring the amount of reflected power while adjusting the capacitances C1-C3 in accordance with a predefined algorithm. Various techniques, such as those described in U.S. Pat. No. 4,954,212 entitled IMPROVED ENDPOINT DETECTION SYSTEM AND METHOD FOR PLASMA ETCHING, hereby incorporated by reference, may be employed to detect the endpoint of the etching process by comparing the sensed reflected power with a specified level indicative of the etching endpoint.

As will become apparent from the following discussion, the etching technique of the present invention may be implemented using a conventional plasma etching chamber such as that shown in FIG. 1. The dual-mode etching process described herein contemplates incorporating a thin film layer between a designated layer to be etched and underlying layers of a target semiconductor structure. The thin film serves to trigger generation of an endpoint signal upon commencing etch of the thin film, at which time etching of the designated layer at a high level of power has been completed. The high-power etch process may thus be terminated before the occurrence of any significant etching of the underlying semiconductor layer. In a preferred embodiment of the present invention the thin film is then removed from the underlying layer by using one of various standard low-power etching techniques.

For the purposes of the present invention the term "light" is defined to include all electromagnetic radiation emissions generated in a plasma etcher which can be detected by optical sensors, even if the wavelengths of those emissions do not fall in the visible range.

An "endpoint signal" is herein defined to be a signal that either falls or rises at the endpoint of a plasma etching process. Internal to the plasma etcher, light intensity based endpoint signals that rise at endpoint are related to the concentration of reactants in the plasma chamber or the concentration of products of reactions involving the underlying material. Endpoint signals that fall at endpoint are related to the concentration of reactive intermediates or products of reactions involving the material being etched.

Oxide Spacer Etching Process

Figure 2A:
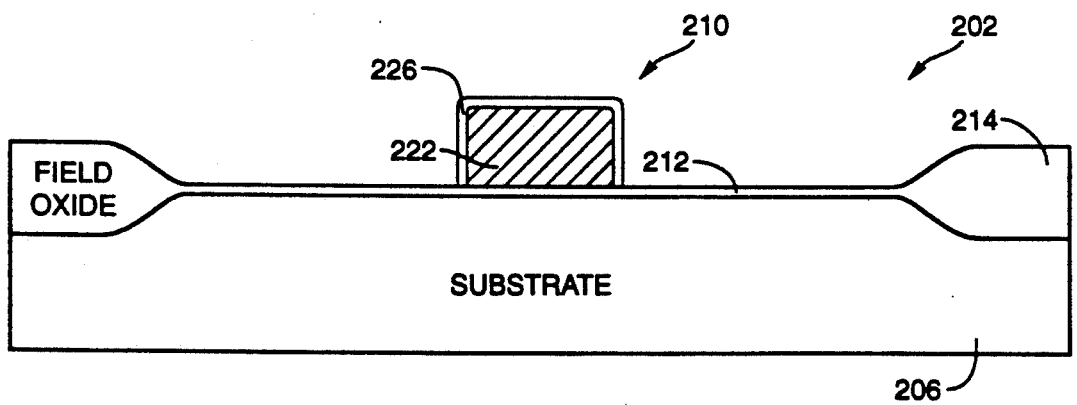
FIGS. 2A-2C are a sequence of cross-sectional illustrations depicting a conventional oxide spacer etching process.

A particular prior art etching technique, nominally termed an oxide spacer etch, will be described with reference to FIGS. 2A-2C in order to more particularly identify the advantages of the etching methodology of the present invention. FIG. 2A shows a cross-sectional view of a first semiconductor structure 202 upon which the prior art spacer etch is to be performed. The first structure 202 includes an underlying silicon substrate 206, polysilicon gate member 210, thin gate oxide 212, and field oxide region 214. Referring to FIGS. 2A and 2C, the objective of the oxide spacer etch is to laterally append spacer material 234 to the gate member 210 of the structure 202. As is well known, at least one purpose served by the spacers 234 is to assist in preventing ions implanted in the substrate 206 during later processing from diffusing into the substrate region beneath the gate member 210.

The first semiconductor structure 202, shown in cross-section in FIG. 2A, may be fabricated as follows. The starting material will generally consist of a wafer of P-type monocrystalline silicon. The substrate 206 shown in the Figures comprises a small portion of such a wafer. The steps for initially preparing the wafer and for forming field oxide are well known to those skilled in the art and are not therefore described here.

The steps for fabricating the semiconductor structure 202 shown in FIG. 2A from a prepared wafer are, in sequence:

1) form the thin gate oxide 212 of approximately 50 to 400 angstroms;
2) deposit an overlying polysilicon gate layer;
3) pattern and etch the polysilicon gate layer using conventional photoresist masking and etching in order to form the polysilicon gate member 210 (FIG. 2A); and
4) reoxidize the gate member 210 to create a reoxidized polysilicon layer 226.

These processing steps are well known to those skilled in the art and are therefore not further described here.

Figure 2B:
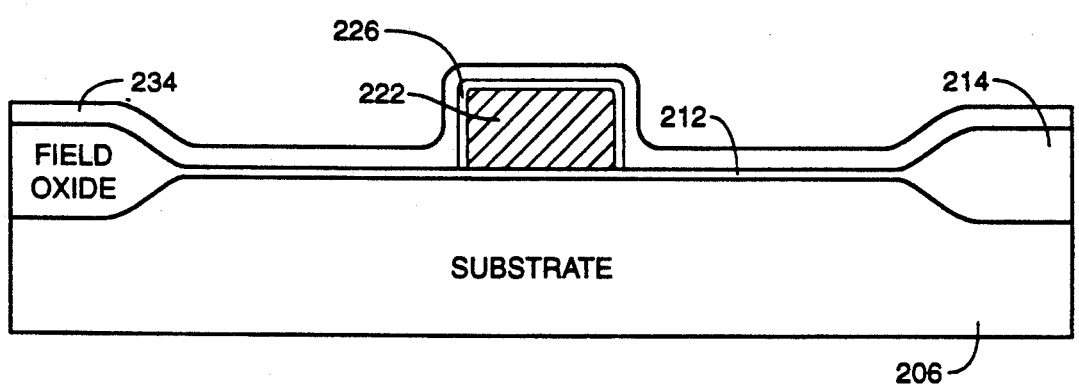
Figure 2C:
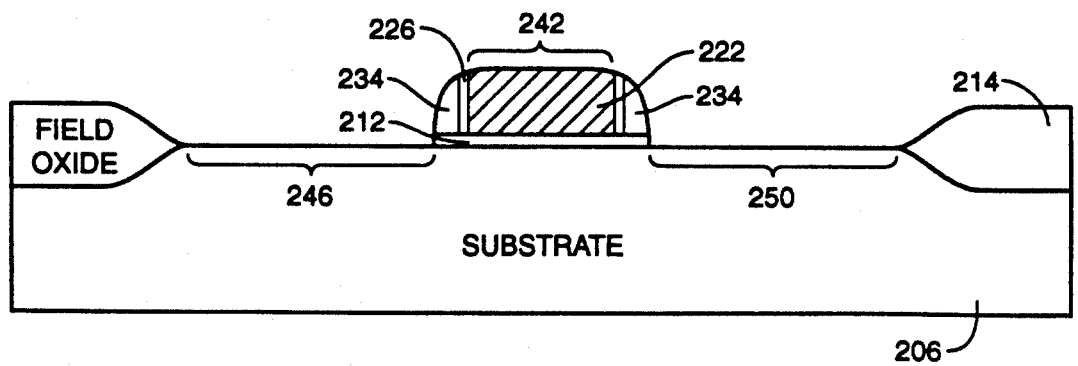

Referring to the cross-sectional representation of FIG. 2B, the next step in a conventional oxide spacer etch is to deposit a layer 234 of tetro ethyl orthosilicate (TEOS) having a thickness of approximately 3000 angstroms. The multi-layer structure of FIG. 2B is then inserted into the chamber of a plasma etching apparatus such as that shown in FIG. 1. The ensuing high-power plasma etching process operates to destroy sequential horizontal planes of the TEOS layer 234, thus defining the TEOS spacers 234 (FIG. 2C).

As mentioned above, the optical sensor 140 can be implemented so as to generate an endpoint signal when the intensity of light at a monitored frequency decreases below a specified threshold value. In the instant example the monitored frequency could, for example, be one at which the emission intensity of light generated by the plasma 120 increases due to the etching of TEOS. Unfortunately, gate 242, source 246 and drain 250 contact regions (FIG. 2C) are exposed to the plasma 120 contemporaneously with the diminution in optical emission occurring upon completing etch of the TEOS layer 234.

Hence, the plasma 120 can cause lattice damage and introduce contaminants into the substrate and polysilicon layer, which can appreciably degrade the contact regions 242, 246 and 250 during the interval between generation of an endpoint signal and the subsequent disengagement of the power source feeding the plasma 120.

The plasma etching technique of the present invention was developed in an effort to mitigate this type of damage to underlying semiconductor layers. Referring to the cross-sectional illustrations of FIGS. 3A-3E, there is shown an improved oxide spacer etching technique designed to substantially eliminate the damage to metal contact areas engendered by high-power etching of an overlying TEOS layer. It is understood that the scope of the present invention is not limited to the method exemplified by FIGS. 3A-3E, and is generally applicable to semiconductor fabrication processes involving plasma etching.

Figure 3A:
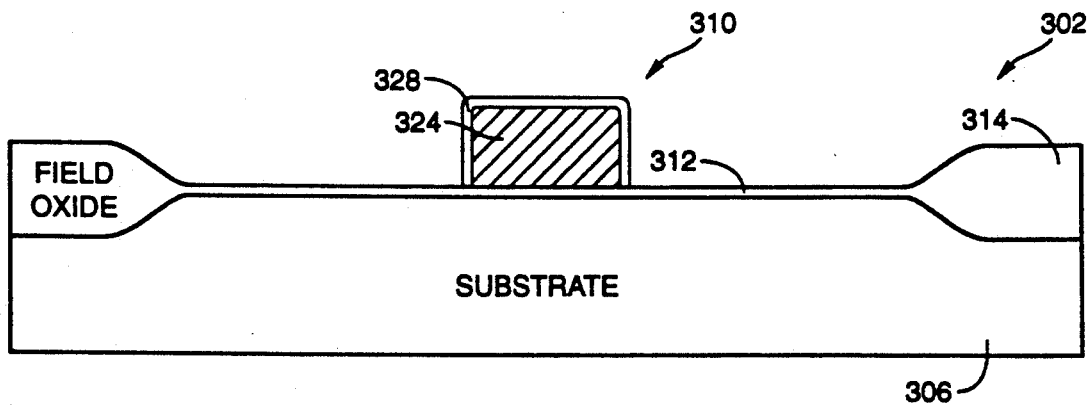
FIGS. 3A-3E are a sequence of cross-sectional illustrations depicting an improved oxide spacer etch performed in accordance with the dual-mode etching technique of the present invention.

FIG. 3A depicts in cross-section a second semiconductor structure 302 substantially identical to the first semiconductor structure 202 depicted in FIG. 2A. The second structure 302 includes an underlying silicon substrate 306, polysilicon gate member 310, thin gate oxide region 312, and field oxide region 314. The gate member 310 is comprised of a polysilicon layer 324 and overlying reoxidized polysilicon layer 328. The second structure 302 of FIG. 3A is fabricated starting from a p-type silicon wafer in the same manner as that described above with reference to the first semiconductor structure 202 of FIG. 2A. The primary objective of the improved oxide spacer etch remains the same as that of a conventional oxide spacer etch; namely, to augment the gate member 310 with spacer material 344 (FIG. 3E).

Figure 3B:
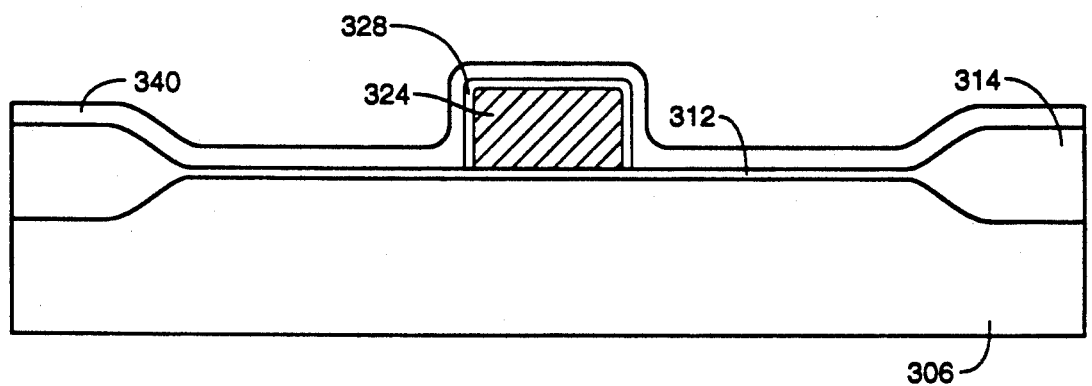

As shown in FIG. 3B, a thin (e.g. 40 angstroms) layer 340 of a dielectric material such as silicon nitride ($Si_3N_4$) is initially applied to the surface of the second semiconductor structure 302 using conventional deposition techniques. The thin layer 340 may also be realized from other materials which have suitable dielectric characteristics (e.g. similar to those of silicon nitride), and which are capable of being removed by standard plasma or wet etching techniques. For example, amorphous silicon may be removed by standard halocarbon plasmas (i.e. those containing carbon, hydrogen, and fluorine), and has an acceptably high dielectric constant of approximately 11.7.

The sole purpose of the thin film 340 is to provide a marker for stopping a high power plasma etch process before the underlying gate and substrate are damaged. For this reason the thin film layer 340 may be called a sacrificial layer.

Figure 3C:
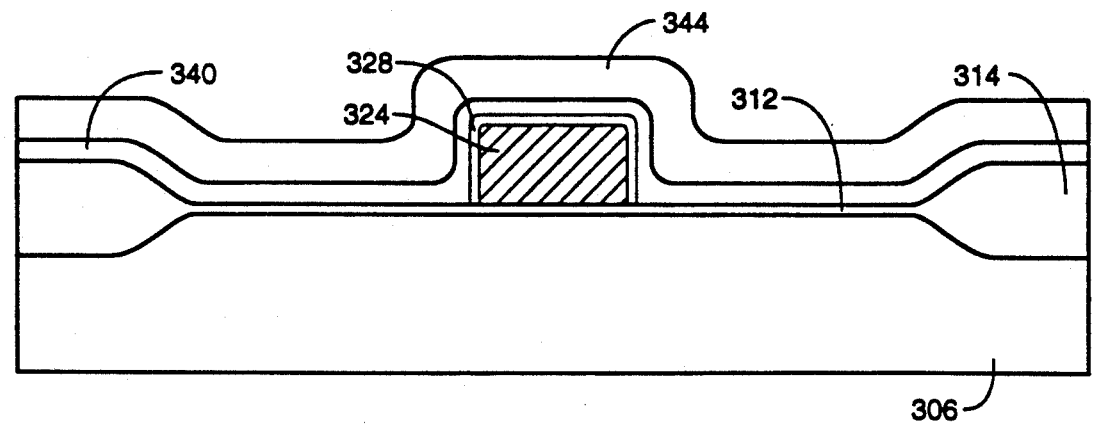
Figure 3D:
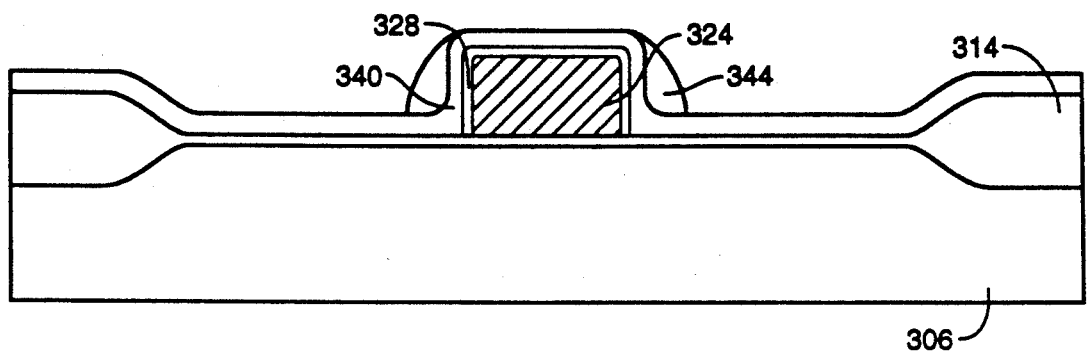
Figure 3E:
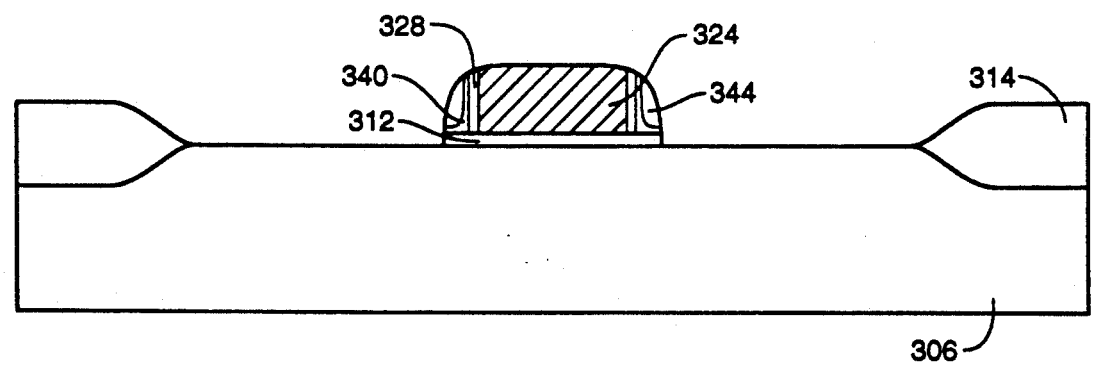

Referring to FIG. 3C, in the next step of the improved etching process a TEOS layer 344 of approximately 3000 angstroms is applied to the surface of the thin film layer 340. The multi-layer structure of FIG. 2B is then inserted into the chamber of a plasma etching apparatus such as that shown in FIG. 1. A high-power (e.g. 400 to 800 Watts) plasma etching process is next conducted in which the TEOS layer 344 is gradually removed. In the improved etching process of the present invention an endpoint signal is generated upon completing etching of TEOS layer 344 and the simultaneous exposure of thin film layer 340 to the etching plasma (FIG. 3D). The occurrence of this endpoint condition may be detected by monitoring the concentration within the etching plasma of one or a combination of substances.

For example, for a thin film layer 340 of silicon nitride etched by a halocarbon plasma the product silicon fluoride (SiF) is created. The presence of silicon fluoride within the etching plasma leads to increased optical emission at the wavelengths of 640 and 777 nm. Accordingly, the optical sensor 140 (FIG. 1) can be implemented so as to generate an endpoint signal when the light intensity at 640 nm., or at 777 nm., or at both 640 and 777 nm. increases above a predefined threshold value. The precise determination of the threshold value will be influenced by parameters such as the volume of the plasma etching chamber, the particular level of power supplied to the plasma chamber, and the density of the halocarbon plasma. Other reaction products created as a consequence of etching silicon nitride, together with preferred optical wavelength(s) at which teh light intensity of the plasma is to be monitored for the occurrence of an endpoint condition are listed below:

| PRODUCT | MONITORING WAVELENGTH |
|---|---|
| carbon monoxide (CO) | 484 nm. |
| carbon dioxide ($CO_2$) | 288 nm. |
| oxygen (O) | 437 nm. |
| hydroxide (OH) | 307 nm. |
| silicon (Si) | 252 nm., 288 nm. |
| $SiF_2$ | 390 nm., 401 nm. |
| SiF | 640 nm., 777 nm. |
| silicon oxide (SiO) | 241 nm. |

The endpoint condition described above may also be determined by monitoring optical wavelengths at which the light intensity is influenced by the etching of the TEOS layer 344. In particular, light intensity variation at these wavelengths results from changes in the concentration within the plasma of reactive intermediates or products generated while the TEOS layer 344 is being etched. It follows that an endpoint signal may be generated by monitoring selected wavelengths for a decrease in light intensity precipitated by completion of the TEOS etch (e.g. wavelengths associated with CO, $CO_2$, O, OH, SiO).

For plasmas having halocarbon-type chemistries a reduction in the concentration of one or a combination of the reactants listed below may be used to trigger the generation of an endpoint signal. Again, such a diminution in concentration will be indicated by a sufficiently large decrease in light intensity at the indicated wavelength(s) associated with each reactant.

| REACTANT | MONITORED WAVELENGTH |
|---|---|
| CF | 240 nm., 256 nm. |
| $CF_2$ | 249 nm. |
| Fluorine (F) | 624 nm. |

Synthesis of the endpoint signal need not be triggered exclusively by either increases in light intensity within the plasma due to commencing etch of the thin film 340 or by intensity decreases arising from completing etching of the TEOS layer 344. Rather, in certain instances reliability may be enhanced by implementing the optical sensor 140 such that a composite endpoint signal predicated on:

(i) an increase in optical intensity at the wavelength associated with a reaction product, and (ii) a contemporaneous decrease in intensity at the wavelength of a plasma reactant, is generated when, for example, a predefined arithmetic combination of (i) and (ii) above exceeds a predefined threshold.

Figure 4:
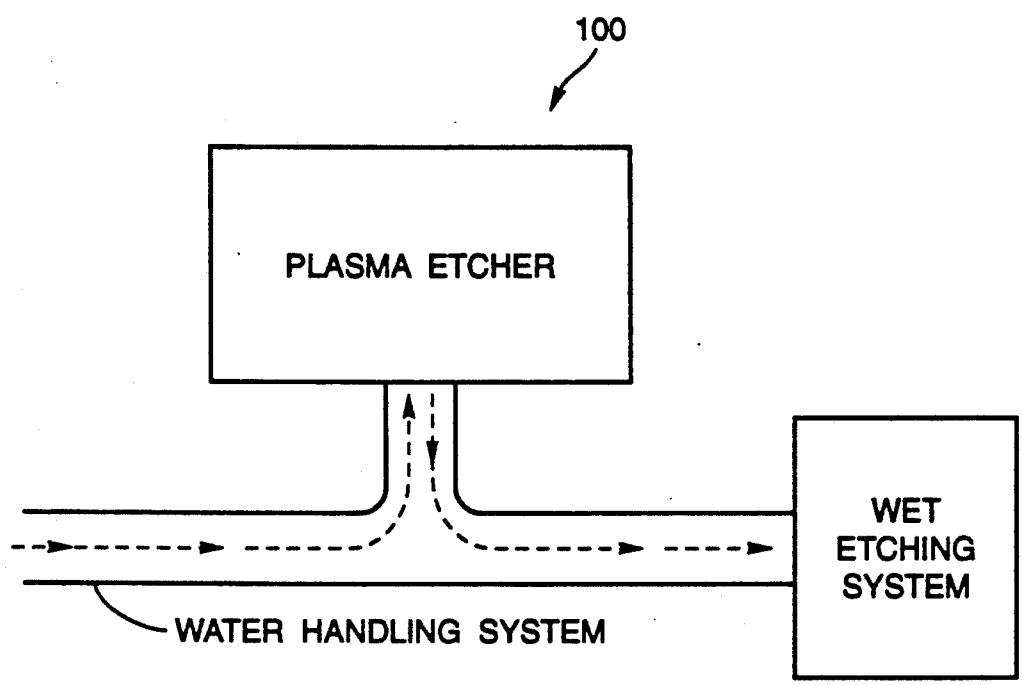
FIG. 4 shows a block diagrammatic representation of a wafer processing system having both a plasma etch chamber and a conventional chemical wet etching system.

Referring to FIG. 3E, the etching process may then be completed by using a low-power (e.g. 100 Watt) plasma etch disposed to induce little or no damage to the surface of the substrate 306 during the course of removing the thin dielectric layer 340. The controller 134 will preferably be programmed to initiate the low-power etching cycle in response to the initial endpoint signal. A second endpoint signal indicating removal of the thin layer 340 may then be conventionally generated as a way of terminating the low-power etch upon exposure of the substrate 306. Any incidental exposure of the substrate 306 to the low power plasma will result in significantly less surface degradation than would comparable contact with a high-energy plasma. Alternatively, the dielectric layer 340 can be removed using various commercially available wet chemical etchants capable of dissolving the layer 340 without appreciably harming the substrate 306, for instance using the system configuration shown in FIG. 4.

Contact Etching Process

Figure 5A:
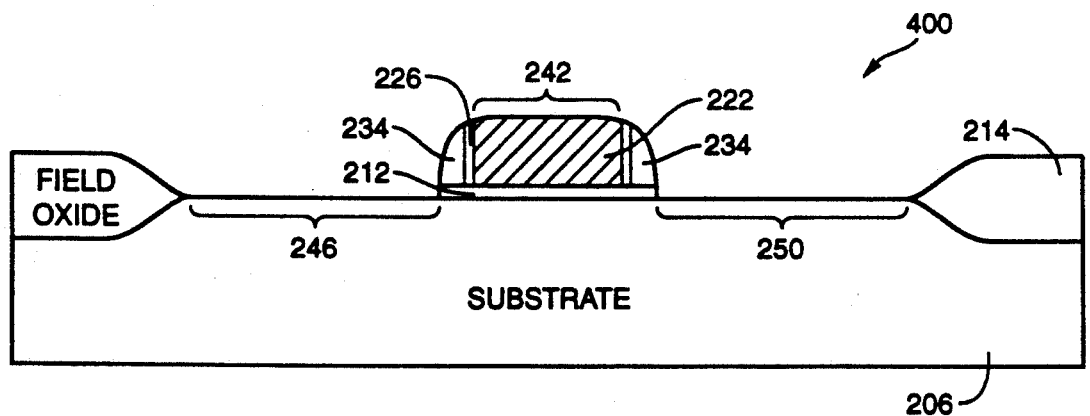
FIGS. 5A-5E are a sequence of cross-sectional illustrations depicting a conventional contact etching process.
Figure 5B:
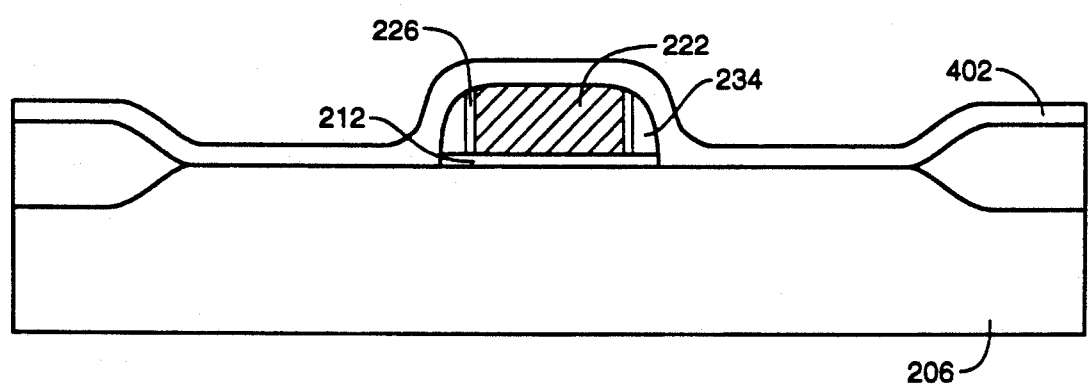
Figure 5C:
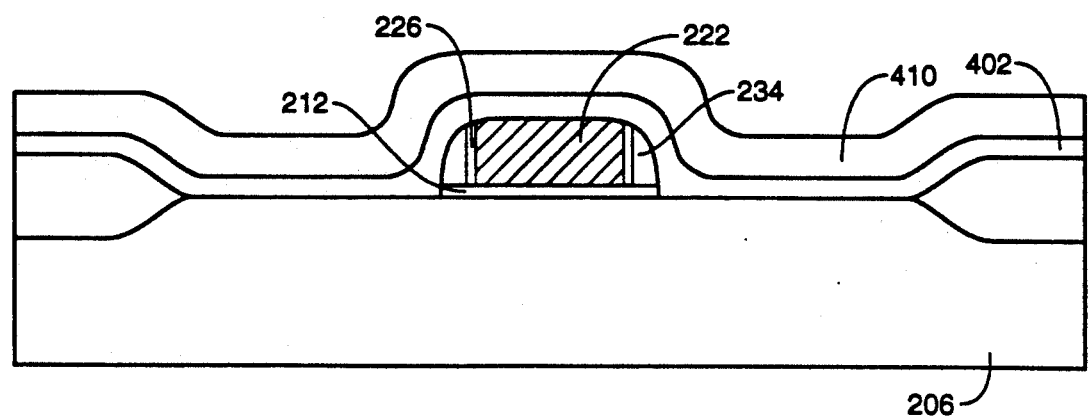
Figure 5D:
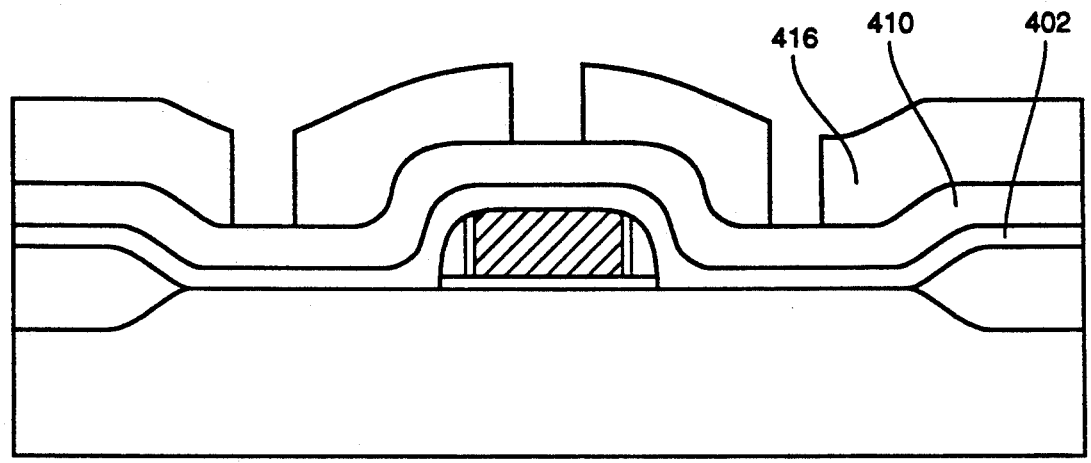
Figure 5E:
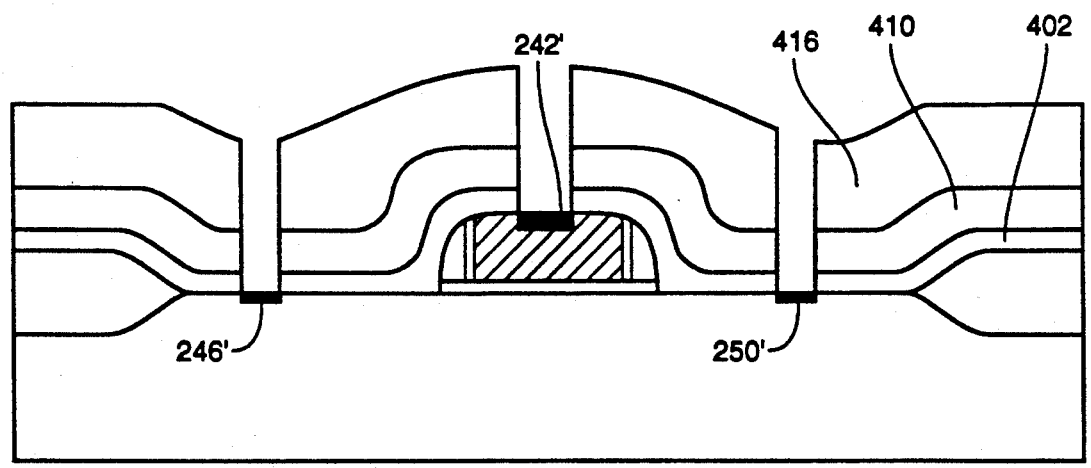

Referring to the cross-sectional representations of FIGS. 5A–5E, there is illustrated a conventional method of preparing a spacer-etched semiconductor structure 400, identically corresponding to the structure depicted in FIG. 2C, to further undergo a metallization process in which metal is deposited on selected surface areas. Referring to FIG. 5A, metallization of the gate 242, source 246 and drain 250 contact regions of the spacer-etched device 400 facilitates electrical connection to external control lines (not shown). In a standard contact etching process a TEOS layer 402 having a thickness of approximately 1500 angstroms is initially deposited over the entire surface of the spacer-etched structure 400 (FIG. 5B). As shown in FIG. 5C, a layer of silicon glass 410 doped with, for example, boron and phosphorous (i.e. BPSG) and having a thickness of approximately 4500 angstroms is then used to overlay the TEOS layer 402. A photoresistive contact masking pattern 416 (FIG. 5D) synthesized through conventional photolithographic techniques is applied to the BPSG layer 410 prior to immersion of the semiconductor structure into the chamber of a plasma etching apparatus such as that shown in FIG. 1. The ensuing high-power plasma etching process operates to remove the exposed portions of the TEOS and BPSG layers 402 and 410 not covered with photoresist 416.

As noted above, the optical sensor 140 can be implemented so as to generate an endpoint signal when the intensity of light at a monitored frequency, such as that associated with etching TEOS, decreases below a specified threshold value. Unfortunately, during a conventional contact etch the plasma 120 impinges upon the contact regions contemporaneously with the diminution in optical emissions from the plasma occurring upon completion of etching the TEOS layer 402. As in the case of a conventional spacer etch, when energized at typical power levels (e.g. 400 to 800 Watts) the plasma 120 can appreciably degrade gate contact region 242' and substrate contact regions 246' and 250' (FIG. 5E) underlying the gate, source and drain contact regions prior to deactivation of the plasma chamber.

Figure 6A:
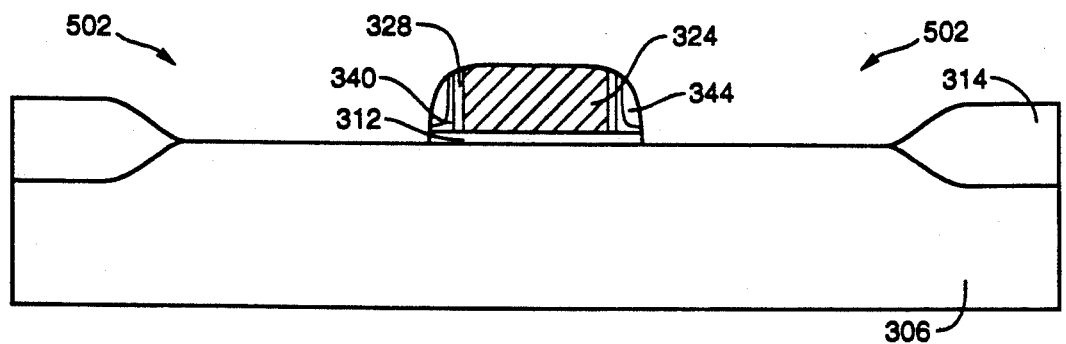
FIGS. 6A-6F are a sequence of cross-sectional illustrations depicting an improved contact etch performed in accordance with the dual-mode etching technique of the present invention.
Figure 6B:
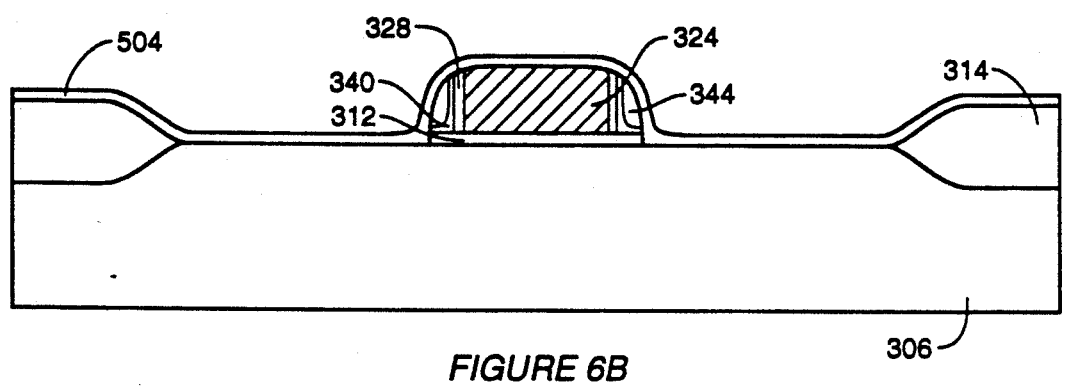

Referring to the cross-sectional views depicted by FIGS. 6A–6F, there is shown an improved contact etching technique designed to substantially eliminate etching damage inflicted upon the gate and substrate regions over which metal contacts are to be positioned. FIG. 6A shows an improved spacer-etched semiconductor structure 502 fabricated in accordance with the inventive contact etch process described in connection with FIGS. 3A–3E. As shown in FIG. 6B, a thin (e.g. 40 angstroms) layer 504 of a dielectric material such as silicon nitride ($Si_3N_4$) is initially applied to the surface of the improved spacer-etched structure 502 using conventional deposition techniques. Again, the thin layer 504 may be alternatively realized from materials which have suitable dielectric characteristics (e.g. amorphous silicon), and which are capable of being removed by standard plasma etching techniques.

Figure 6C:
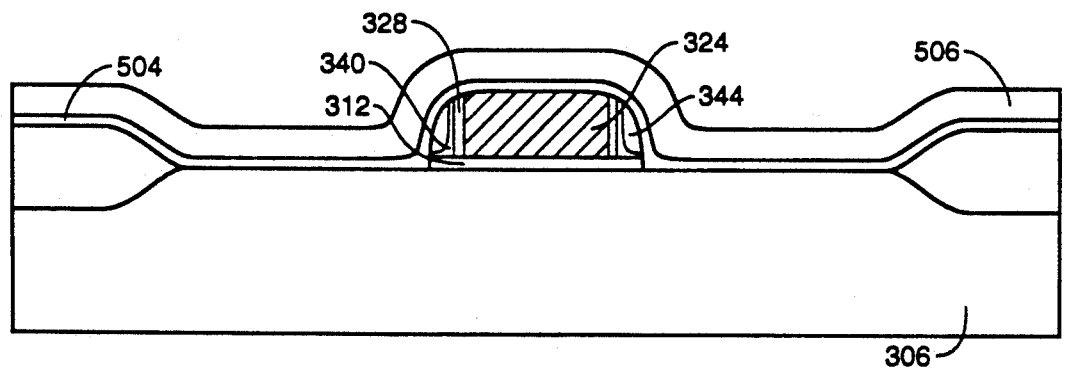
Figure 6D:
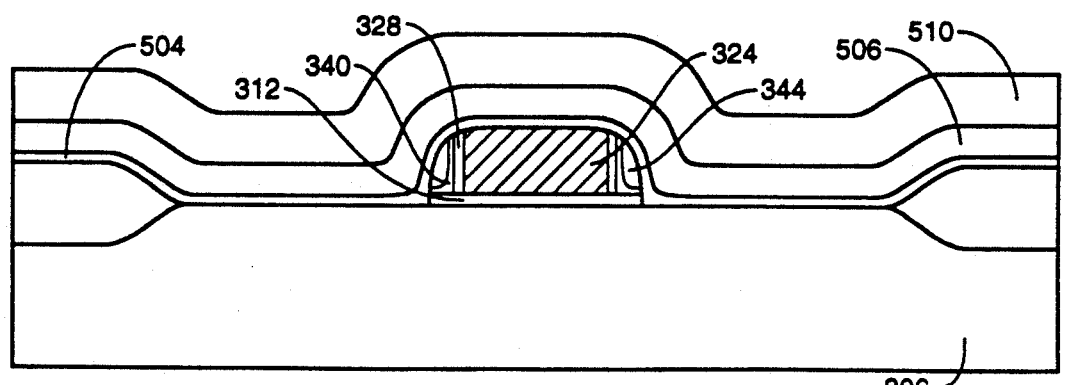
Figure 6E:
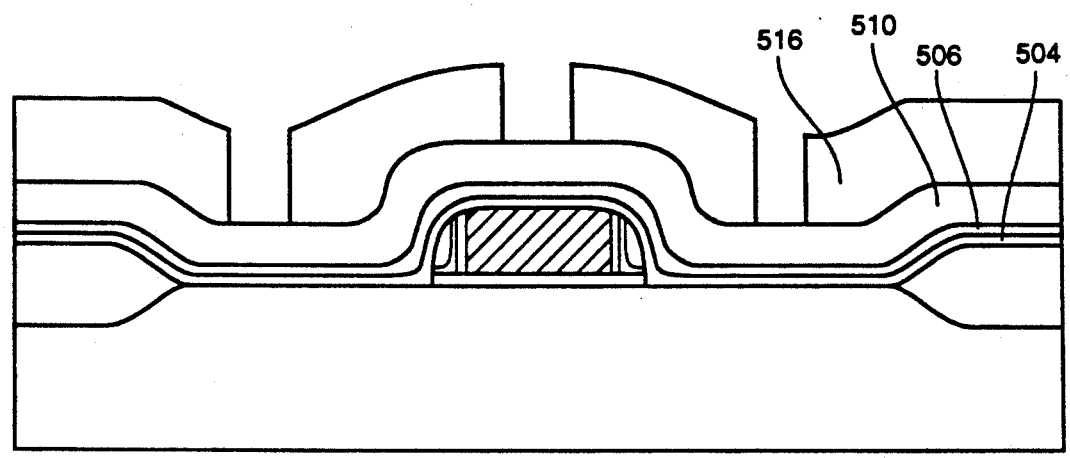
Figure 6F:
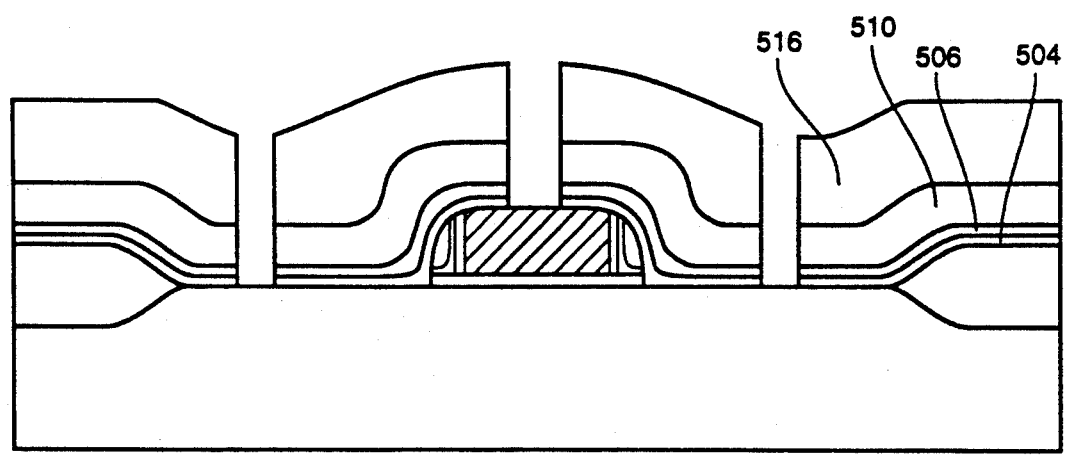

Referring to FIG. 6C, in the next step of the improved contact etching process a TEOS layer 506 of approximately 1500 angstroms is applied to the surface of the thin film layer 510. As is illustrated by FIG. 6D, a BPSG layer 510 of approximately 4500 angstroms is again employed to cover the TEOS layer 504. Conventional photolithographic processes are utilized to deposit a photoresistive contact masking pattern 516 (FIG. 6E) upon the BPSG layer 510 prior to the commencement of high-power plasma etching. In a substantially similar manner to that described previously with regard to the improved oxide spacer etch, the inventive contact etching technique contemplates successive high-power and low-power etching cycles. More specifically, in the initial high-power (e.g. 400 to 800 Watts) mode the plasma etch process is conducted until the exposed regions of the BPSG and TEOS layers 510 and 506 have been removed. An endpoint signal is generated upon completing etching of the TEOS layer 344 and thereby exposing the thin film layer 340 to the etching plasma.

As previously discussed, the endpoint condition may be detected by monitoring the concentration within the plasma of one or a combination of products and reactants associated with etching of the thin film layer 340. Subsequent to termination of the high-power etching cycle a low-power (e.g. 100 Watt) plasma etch or a wet etch process may then be employed to remove the thin dielectric layer 340 without etching or damaging the underlying substrate 306 to any significant degree.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims. For example, plasma etchers employing endpoint monitoring apparatus sensitive to parameters such as the DC bias level of the plasma, rather than to the light intensity thereof, may be used to implement the improved etching technique of the present invention. In DC-bias monitoring etchers an endpoint signal would be triggered by the change in the DC bias of the plasma occurring upon initiating etch of the thin film. Similarly, the invention is not limited to the particular oxide and contact etching processes disclosed herein. The teachings of the present invention are equally applicable to plasma etching involving other semiconductor devices.

I claim:

1. A method of etching a designated layer of a specified material on a substrate, the steps of the method comprising:

depositing a thin sacrificial film of a second material distinct from said specified material on said substrate, wherein said thin sacrificial film functions as a plasma etching process marker:

forming said designated layer of said specified material on top of said thin film, wherein said thin sacrificial film is much thinner than said designed layer of said specified material;

etching said designated layer in a plasma etching chamber while applying a first level of power to said plasma etching chamber;

detecting a first endpoint at which time said plasma etching chamber begins etching said thin film of second material; and subsequent to said first endpoint detection, ceasing application of said first level of power to said plasma chamber and removing portions of said thin film remaining on said substrate subsequent to said first endpoint detection by using a process less damaging to said substrate than etching in said plasma etching chamber while applying said first level of power to said plasma etching chamber.

2. The method claim 1, said step of removing including reducing the level of power applied to said plasma etching chamber to a second power level upon detection of said first endpoint; and etching said thin film of said second material in said plasma etching chamber while applying said second level of power to said plasma etching chamber;

whereby damage to said substrate is reduced by applying said second power level to said etching chamber prior to completing said etching of said thin film.

3. The method of claim 1, wherein a photolithography masking step is performed between said forming step and said etching step so as to define regions of said designated layer which are to be etched.

4. The method of claim 1, said step of detecting including the steps of:

monitoring the intensity of light in said plasma etching chamber at a predefined wavelength, said predefined wavelength corresponding to light generated within said plasma etching chamber during etching of said thin film;

comparing said monitored light intensity with a threshold level; and generating an endpoint signal when said monitored light intensity crosses said threshold level.

5. The method of claim 1, said step of detecting including the steps of:

monitoring the intensity of light in said plasma etching chamber at a predefined wavelength, said predefined wavelength corresponding to light generated as a consequence etching said designated layer; and generating an endpoint signal when said monitored intensity falls below a threshold level.

6. The method of claim 1, said step of detecting including monitoring the intensity of light in said plasma etching chamber at a predefined wavelength, said predefined wavelength corresponding to light generated as a consequence of etching said thin film; and generating an endpoint signal when said monitored intensity increases above a threshold level.

7. The method of claim 1, said step of detecting including monitoring the intensity of light in said plasma etching chamber at a predefined wavelength, said predefined wavelength being that of light generated in proportion to the concentration of etching reactants within said plasma etching chamber; and generating an endpoint signal when said monitored intensity increases above a threshold level.

* * * * *